United States Patent
Gill et al.

(10) Patent No.: US 11,880,111 B1
(45) Date of Patent: Jan. 23, 2024

(54) TUNABLE LENS SYSTEMS WITH VOLTAGE SELECTION CIRCUITRY

(71) Applicant: Apple Inc., Cupertino, CA (US)

(72) Inventors: Patrick R. Gill, Los Altos, CA (US); Yu Horie, Cupertino, CA (US); Eric G. Smith, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/181,911

(22) Filed: Feb. 22, 2021

Related U.S. Application Data (60) Provisional application No. 62/985,240, filed on Mar. 4, 2020.

(51) Int. Cl.
 *G02F 1/1343* (2006.01)
 *G02F 1/1345* (2006.01)
 (Continued)

(52) U.S. Cl.
 CPC .......... *G02F 1/137* (2013.01); *G02F 1/13439* (2013.01); *G02F 1/134309* (2013.01); *G02F 1/294* (2021.01); *G02F 1/1345* (2013.01)

(58) Field of Classification Search
 CPC ............. G02F 1/1335; G02F 1/133526; G02F 1/1343; G02F 1/13439; G02F 1/134309;
 (Continued)

(56) References Cited

U.S. PATENT DOCUMENTS

| | | | | |
|---|---|---|---|---|
| 5,434,599 A | * | 7/1995 | Hirai | G09G 3/3685 345/94 |
| 6,011,653 A | * | 1/2000 | Karasawa | H04N 5/7491 348/E5.145 |

(Continued)

FOREIGN PATENT DOCUMENTS

| | | |
|---|---|---|
| JP | 2008203360 A | 9/2008 |
| WO | 2017216716 A1 | 12/2017 |

OTHER PUBLICATIONS

Liwei Li et al., Near-Diffraction-Limited and Low-Haze Electro-Optical Tunable Liquid Crystal Lens with Floating Electrodes, Optical Society of America, Mar. 29, 2013, vol. 21, No. 7, Liquid Crystal Institute, Kent University, Kent, OH, United States.

(Continued)

*Primary Examiner* — Thoi V Duong
(74) *Attorney, Agent, or Firm* — Treyz Law Group, P.C.; Kendall P. Woodruff (57) ABSTRACT

A pair of eyeglasses may include one or more adjustable lenses that are each configured to align with a respective one of a user's eyes. The adjustable lenses may each include electrically modulated optical material such as one or more liquid crystal cells, each having a phase profile that is adjusted using patterned electrodes. Analog voltages may be provided to the patterned electrodes through variable-resistance conductive paths that are each coupled to a subset of the patterned electrodes. Digital voltage selection circuitry may be used to select which analog voltage to apply to each of the variable-resistance conductive paths from a predetermined set of analog voltages that are generated off of the lens. The digital voltage selection circuitry may include an array of multiplexers, each of which selects a desired voltage based on control signals received from digital control circuitry such a shift register and/or a decoder.

19 Claims, 9 Drawing Sheets

(51) Int. Cl.
*G02F 1/137* (2006.01)
*G02F 1/29* (2006.01)

(58) Field of Classification Search
CPC .. G02F 1/1345; G02F 1/13452; G02F 1/1347; G02F 1/137; G02F 1/294
See application file for complete search history.

(56) References Cited

U.S. PATENT DOCUMENTS

| | | | |
|---|---|---|---|
| 6,295,044 B1* | 9/2001 | Geisow | G02F 1/13439 345/97 |
| 8,248,576 B2 | 8/2012 | Chang | |
| 8,885,139 B2 | 11/2014 | Peyghambarian et al. | |
| 10,288,904 B2 | 5/2019 | Yadin et al. | |
| 10,345,656 B2 | 7/2019 | Li et al. | |
| 2008/0316234 A1* | 12/2008 | Toriumi | G09G 3/2011 345/690 |
| 2016/0143528 A1 | 5/2016 | Wilf et al. | |
| 2017/0068134 A1 | 3/2017 | Yadin et al. | |
| 2017/0160440 A1 | 6/2017 | Yadin et al. | |
| 2017/0353188 A1* | 12/2017 | Saeki | H03F 3/301 |

OTHER PUBLICATIONS

Brett E. Bagwell et al. Liquid Crystal Based Active Optics, Proceedings of SPIE—The International Society for Optical Engineering, Aug. 15-16, 2006, Novel Optical Systems Design and Optimization IX—San Diego, CA, United States.

* cited by examiner

TUNABLE LENS SYSTEMS WITH VOLTAGE SELECTION CIRCUITRY

This application claims the benefit of U.S. provisional patent application No. 62/985,240, filed Mar. 4, 2020, which is hereby incorporated by reference herein in its entirety.

BACKGROUND

This relates generally to optical systems, and, more particularly, to devices with tunable lenses.

Eyewear may include optical systems such as lenses. For example, eyewear such as a pair of glasses may include lenses that allow users to view the surrounding environment.

It can be challenging to design devices such as these. If care is not taken, the optical systems in these devices may not be able to accommodate different eye prescriptions and may not perform satisfactorily.

SUMMARY

Eyeglasses may be worn by a user and may include one or more adjustable lenses each aligned with a respective one of a user's eyes. For example, a first adjustable lens may align with the user's left eye and a second adjustable lens may align with the user's right eye. Each of the first and second adjustable lenses may include one or more liquid crystal cells or other voltage-modulated optical material. Each liquid crystal cell may include a layer of liquid crystal material interposed between transparent substrates. Control circuitry may apply control signals to an array of electrodes in the liquid crystal cell to adjust a phase profile of the liquid crystal material.

Analog voltages may be provided to the array of electrodes through variable-resistance conductive paths that are each coupled to a subset of the patterned electrodes. The variable-resistance conductive paths may have a serpentine pattern. Digital voltage selection circuitry may be used to select which analog voltage to apply to each of the variable-resistance conductive paths from a predetermined set of analog voltages that are generated off of the lens. The digital voltage selection circuitry may include an array of multiplexers, each of which selects a desired voltage for a given one of the variable-resistance conductive paths based on control signals received from digital control circuitry such a shift register and/or a decoder. By using digital voltage selection circuitry that selects the desired analog voltage from a predetermined set of analog voltages, the number of signal paths between off-lens control circuitry and on-lens circuitry may be reduced, and the need for excessive analog circuitry on valuable lens real estate may be reduced.

The eyeglasses may include a housing, an adjustable lens in the housing having a liquid crystal cell, an array of electrodes, and control lines that apply voltages to the array of electrodes to adjust a phase profile of the liquid crystal cell. The eyeglasses may include off-lens control circuitry in the housing having an operational amplifier that receives a feedback voltage from the adjustable lens and that provides an output voltage to a given one of the control lines based on the feedback voltage and a selected input voltage that is generated by the off-lens control circuitry. The operational amplifier may be used to ensure that the output voltage provided to each control line matches the selected input voltage.

Liquid crystal materials are herein used by way of an example of an electrically modulated optical material. Other electrically modulated optical materials can be used in place of the liquid crystals described herein.

DETAILED DESCRIPTION

Figure 1:
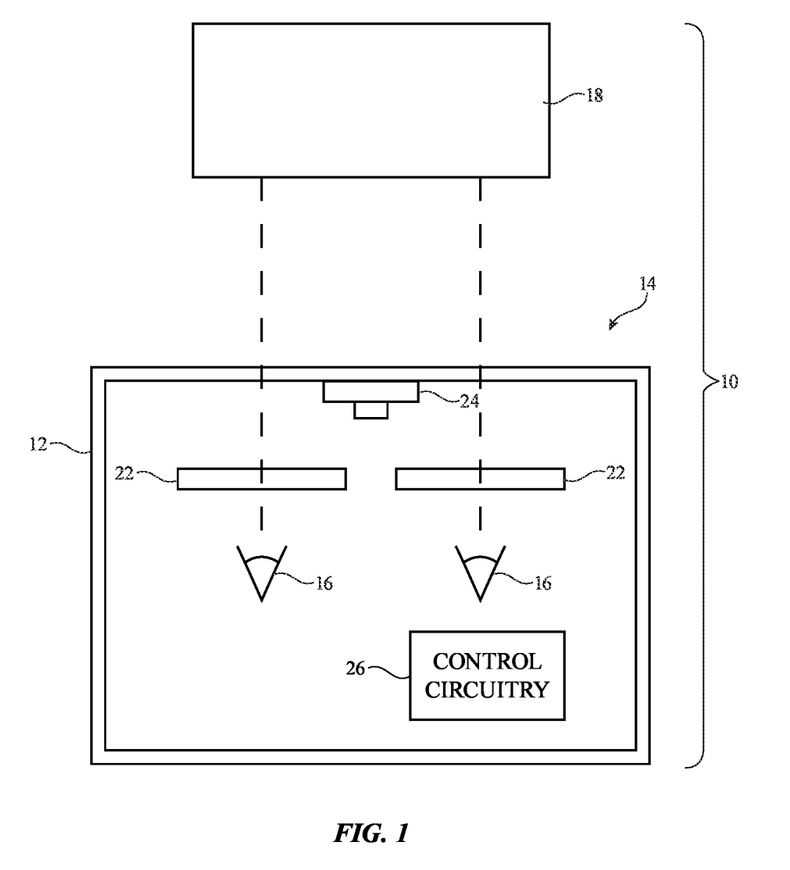
FIG. 1 is a diagram of illustrative system that includes eyeglasses with adjustable lenses in accordance with an embodiment.

An illustrative system having a device with one or more electrically adjustable optical elements is shown in FIG. 1. System 10 may include a head-mounted device such as eyeglasses 14 (sometimes referred to as glasses 14). Glasses 14 may include one or more optical systems such as adjustable lens components 22 mounted in a support structure such as support structure 12. Structure 12 may have the shape of a pair of eyeglasses (e.g., supporting frames), may have the shape of goggles, may form a housing having a helmet shape, or may have other configurations to help in mounting and securing the components of glasses 14 on the head of a user.

Adjustable lens components 22 may form lenses that allow a viewer (e.g., a viewer having eyes 16) to view external objects such as object 18 in the surrounding environment. Glasses 14 may include one or more adjustable lens components 22, each aligned with a respective one of a user's eyes 16. As an example, lens components 22 may include a left lens 22 aligned with a viewer's left eye and may include a right lens 22 aligned with a viewer's right eye. This is, however, merely illustrative. If desired, glasses 14 may include adjustable lens components 22 for a single eye.

Adjustable lenses 22 may be corrective lenses that correct for vision defects. For example, eyes 16 may have vision defects such as myopia, hyperopia, presbyopia, astigmatism, higher-order aberrations, and/or other vision defects. Corrective lenses such as lenses 22 may be configured to correct for these vision defects. Lenses 22 may be adjustable to accommodate users with different vision defects and/or to accommodate different focal ranges. For example, lenses 22 may have a first set of optical characteristics for a first user having a first prescription and a second set of optical characteristics for a second user having a second prescription. Glasses 14 may be used purely for vision correction (e.g., glasses 14 may be a pair of spectacles) or glasses 14 may include displays that display virtual reality or augmented reality content (e.g., glasses 14 may be a head-mounted display). In virtual reality or augmented reality systems, adjustable lens components 22 may be used to move content between focal planes from the perspective of the user. Arrangements in which glasses 14 are spectacles that do not include displays are sometimes described herein as an illustrative example.

Glasses 14 may include control circuitry 26. Control circuitry 26 may include processing circuitry such as microprocessors, digital signal processors, microcontrollers, baseband processors, image processors, application-specific integrated circuits with processing circuitry, and/or other processing circuitry and may include random-access memory, read-only memory, flash storage, hard disk storage, and/or other storage (e.g., a non-transitory storage media for storing computer instructions for software that runs on control circuitry 26).

If desired, control circuitry 26 may include one or more energy storage devices such as one or more batteries and capacitors. Energy storage devices in eyeglasses 14 may be charged via a wired connection or, if desired, eyeglasses 14 may charge energy storage devices using wirelessly received power (e.g., inductive wireless power transfer, using capacitive wireless power transfer, and/or other wireless power transfer configurations).

Glasses 14 may include input-output circuitry such as eye state sensors, range finders disposed to measure the distance to external object 18, touch sensors, buttons, microphones to gather voice input and other input, sensors, and other devices that gather input (e.g., user input from viewer 16) and may include light-emitting diodes, displays, speakers, and other devices for providing output (e.g., output for viewer 16). Glasses 14 may, if desired, include wireless circuitry and/or other circuitry to support communications with a computer or other external equipment. If desired, a sensor system such as sensor system 24 may be used to gather input during use of glasses 14. Sensor system 24 may include an accelerometer, compass, an ambient light sensor or other light detector, a proximity sensor, a scanning laser system, and other sensors for gathering input during use of glasses 14. Sensor system 24 may be used to track a user's eyes 16. For example, sensor system 24 may include one or more digital image sensors, lidar (light detection and ranging) sensors, ultrasound sensors, or other suitable sensors for tracking the location of a user's eyes. As an example, sensor system 24 may be used by control circuitry 26 to gather images of the pupils and other portions of the eyes of the viewer. The locations of the viewer's pupils and the locations of the viewer's pupils relative to specular glints from light sources with known positions or the rest of the viewer's eyes may be used to determine the locations of the centers of the viewer's eyes (i.e., the centers of the user's pupils) and the direction of view (gaze direction) of the viewer's eyes. In some arrangements, sensor system 24 may include a wavefront sensor that measures the aberrations of a user's eyes. Control circuitry 26 may then adjust the optical properties of lens component 22 to correct the user-specific aberrations detected by the wavefront sensor.

Control circuitry 26 may also control the operation of optical elements such as adjustable lens components 22. Adjustable lens components 22, which may sometimes be referred to as adjustable lenses, adjustable lens systems, adjustable optical systems, adjustable lens devices, tunable lenses, etc., fluid-filled variable lenses, and/or may contain electrically adjustable material such as liquid crystal material, volume Bragg gratings, or other electrically modulated material that may be adjusted to produce customized lenses. Each of components 22 may contain an array of electrodes that apply electric fields to portions of a layer of liquid crystal material or other voltage-modulated optical material with an electrically adjustable index of refraction (sometimes referred to as an adjustable lens power or adjustable phase profile). By adjusting the voltages of signals applied to the electrodes, the index of refraction profile of components 22 may be dynamically adjusted. This allows the size, shape, and location of the lenses formed within components 22 to be adjusted.

Figure 2:
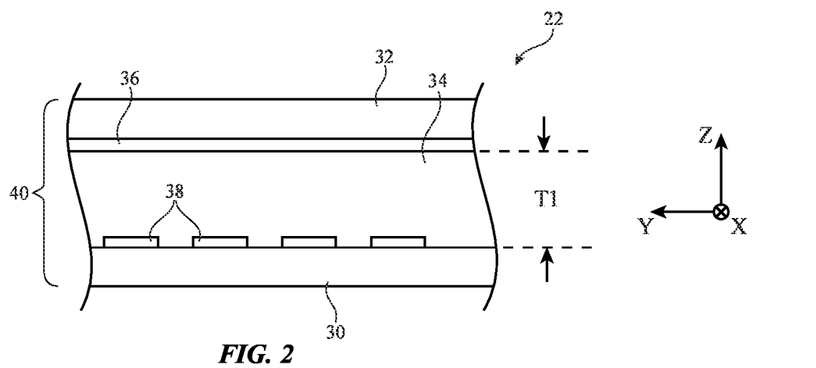
FIG. 2 is a cross-sectional side view of an illustrative liquid crystal cell that may be used to form an adjustable lens in accordance with an embodiment.

A cross-sectional side view of an illustrative adjustable lens component is shown in FIG. 2. As shown in FIG. 2, component 22 may include liquid crystal cell 40. Liquid crystal cell 40 may have a layer of voltage-modulated optical material such as liquid crystal layer 34. Liquid crystal layer 34 may be interposed between transparent substrates such as upper substrate 32 and lower substrate 30. Substrates 32 and 30 may be formed from clear glass, sapphire or other transparent crystalline material, cellulose triacetate, transparent plastic, or other transparent layers. Component 22 may have a pattern of electrodes that can be supplied with signals from control circuitry 26 to produce desired voltages on component 22. In the example of FIG. 2, these electrodes include elongated electrodes (e.g., strip-shaped electrodes) such as electrodes 38 on substrate 30 that run along the X dimension and a common electrode such as common electrode 36 on substrate 32 (e.g., a blanket layer of conductive material on substrate 32). Electrodes 36 and 38 may be formed from transparent conductive material such as indium tin oxide, conductive polymers such as poly(3,4-ethylenedioxythiophene) polystyrene sulfonate (PEDOT:PPS), or other transparent electrode structures and may be located on outer and/or inner surfaces of substrates 32 and 30.

At each location of electrode strips 38 in component 22, a desired voltage may be applied across liquid crystal layer 34 by supplying a first voltage to electrode 38 and a second voltage (e.g., a ground voltage) to common electrode 36. The liquid crystal between the two electrodes will receive an applied electric field with a magnitude that is proportional to the difference between the first and second voltages on the electrodes. By controlling the voltages on electrodes 38 and common electrode 36, the index of refraction of liquid crystal layer 34 of component 22 can be dynamically adjusted to produce customized lenses.

In the example of FIG. 2, strip-shaped electrodes 38 (sometimes referred to as finger electrodes, patterned electrodes, etc.) extend parallel to the X-axis. This allows the index-of-refraction profile (sometimes referred to as the phase profile) of liquid crystal cell 40 to be modulated in the Y-dimension by applying the desired voltages to each finger electrode 38.

When an electric field is applied to the liquid crystals of layer 34, the liquid crystals change orientation. The speed at which a given liquid crystal material can be reoriented is limited by factors such as the thickness of layer 34 (e.g., thickness T1 of FIG. 2, sometimes referred to as the cell gap). To increase the tuning speed of liquid crystal layer 34 while still achieving a suitable tuning range, adjustable lens component 22 may include two or more liquid crystal cells 40 stacked on top of one another. This type of arrangement is illustrated in FIG. 3.

Figure 3:
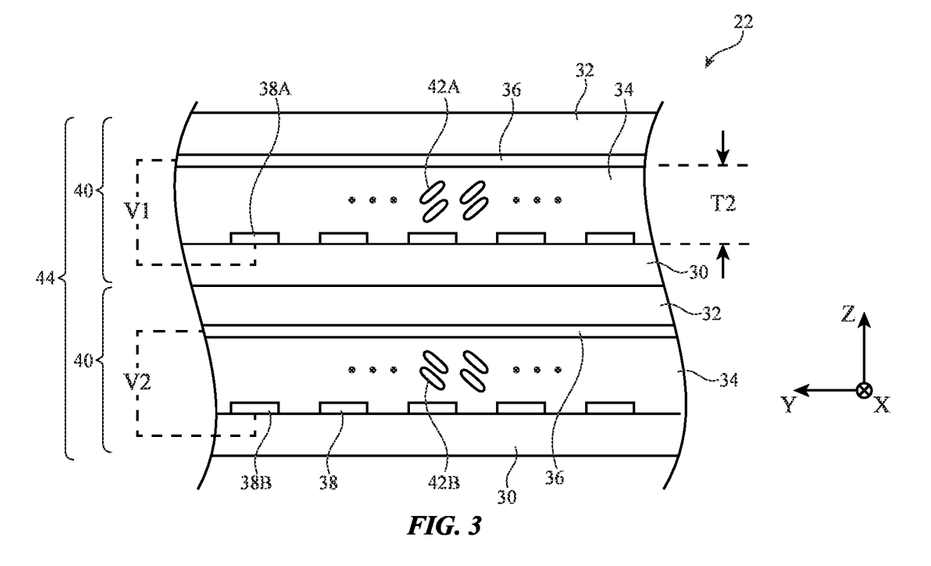
FIG. 3 is a cross-sectional side view of an illustrative liquid crystal module having first and second liquid crystal layers with antiparallel liquid crystal alignment orientations in accordance with an embodiment.

As shown in FIG. 3, adjustable lens component 22 may include liquid crystal module 44. Liquid crystal module 44 may include two or more liquid crystal cells 40. Each liquid crystal cell may include liquid crystal layer 34 interposed between upper substrate 32 and lower substrate 30. Finger electrodes 38 may be formed on each lower substrate 30 and may extend parallel to the X-axis. Common electrode 36 may be formed on each upper substrate 32. If desired, common voltage electrode 36 may be formed on lower substrate 30 and finger electrodes 38 may be formed on upper substrate 32. The example of FIGS. 2 and 3 is merely illustrative.

The cell gap of each liquid crystal cell 40 in module 44 may be less than that of liquid crystal cell 40 of FIG. 2. For example, liquid crystal layers 34 of module 44 in FIG. 3 may each have a thickness T2, which is less than thickness T1 of liquid crystal layer 34 in cell 40 of FIG. 2. The reduced cell gap increases the tuning speed of liquid crystal layers 34 while still maintaining satisfactory tuning range (sometimes referred to as lens power range).

If desired, the liquid crystal alignment orientation (sometimes referred to as a rubbing direction) of liquid crystal cells 40 in module 44 may be antiparallel. In particular, liquid crystal molecules 42A of upper liquid crystal cell 40 may have a first liquid crystal alignment orientation, and liquid crystal molecules 42B of lower liquid crystal cell 40 may have a second liquid crystal alignment orientation that is antiparallel to the first liquid crystal alignment orientation. This type of arrangement may help reduce the angle dependency of phase retardation in module 44.

At each location of finger electrode 38 in component 22, a desired voltage may be applied across each liquid crystal layer 34 by supplying a first voltage to finger electrode 38 and a second voltage (e.g., a ground voltage) to common electrode 36. The liquid crystal between the two electrodes will receive an applied electric field with a magnitude that is proportional to the difference between the first and second voltages on the electrodes. By controlling the voltages on electrodes 38 and common electrode 36, the index of refraction of each liquid crystal layer 34 of component 22 can be dynamically adjusted to produce customized lenses. Because finger electrodes 38 extend along the X-dimension, the phase profile of each liquid crystal cell 40 may be modulated in the Y-dimension by applying the desired voltages to each finger electrode 38.

Overlapping portions of the two liquid crystal layers 34 in module 44 may be controlled using the same or different voltages to achieve the desired index of refraction at that portion of module 44. For example, finger electrode 38A of upper liquid crystal cell 40 in module 44 may overlap finger electrode 38B of lower liquid crystal cell 40 in module 44. A first voltage V1 may be applied across a portion of upper liquid crystal layer 34 overlapping finger electrode 38A, and a second voltage V2 may be applied across a portion of lower liquid crystal layer 34 overlapping finger electrode 38B. Voltages V1 and V2 may be different or may be the same. Control circuitry 26 may determine the ratio of V1 to V2 based on the desired index of refraction at that portion of the liquid crystal module 44 and based on the disposition of the user's eyes 16.

Figure 4:
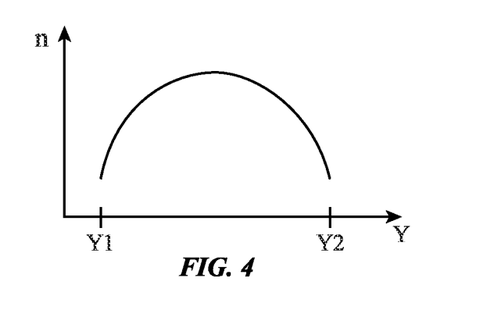
FIGS. 4 and 5 are graphs showing how an adjustable lens may be adjusted so that its refractive index varies as a function of position to produce a desired lens profile in accordance with an embodiment.
Figure 5:
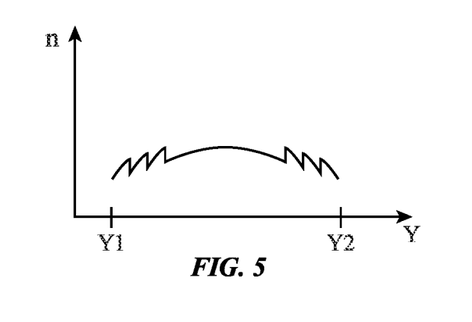

FIGS. 4 and 5 show examples of illustrative index-of-refraction profiles that may be generated by adjustable lens component 22 of FIG. 2 and/or by adjustable lens component 22 of FIG. 3. In the example of FIG. 4, refractive index n has been varied continuously between peripheral lens edges Y1 and Y2. In the example of FIG. 5, refractive index n has been varied discontinuously to produce an index-of-refraction profile appropriate for forming a Fresnel lens. These examples are merely illustrative. If desired, other suitable index-of-refraction profiles may be used using adjustable lens components of the type shown in FIGS. 2 and 3.

In the examples of FIGS. 2 and 3, adjustable lens component 22 includes electrodes that extend in one direction (e.g., the X-dimension of FIGS. 2 and 3), allowing adjustable lens component 22 to modulate the phase profile of component 22 along one direction (e.g., the Y-dimension of FIGS. 2 and 3). If desired, adjustable lens component 22 may include electrodes that extend in multiple directions, thus allowing adjustable lens component 22 to modulate the phase profile of component 22 along multiple directions.

Figure 6:
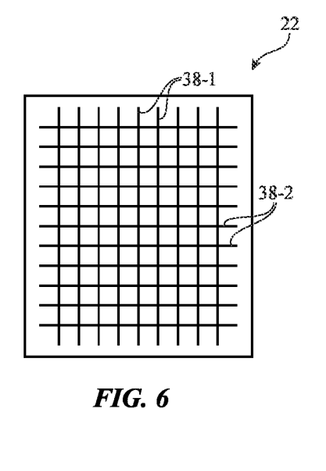
FIG. 6 is a top view of an illustrative adjustable lens component having arrays of electrodes that extend along first and second directions in accordance with an embodiment.

FIG. 6 is a top view of illustrative adjustable lens component 22 having first finger electrodes 38-1 oriented along a first direction and second finger electrodes 38-2 oriented along a second direction different from the first direction. First finger electrodes 38-1 may, for example, be oriented at 90-degree angles relative to second finger electrodes 38-2, or other suitable orientations may be used. Each set of electrodes may modulate the phase profile of a liquid crystal layer along an associated dimension. Adjustable lens component 22 of the type shown in FIG. 6 with two orientations of electrodes may therefore be used to create phase profiles that vary along two dimensions. For example, electrodes

38-1 may produce a first quadratic phase profile along a first dimension and electrodes 38-2 may produce a second quadratic phase profile along a second dimension, thus providing lens components 22 with a combined phase profile matching that of a crossed-cylinder lens, with a spherical profile where the cylinders overlap (as an example).

Figure 7:
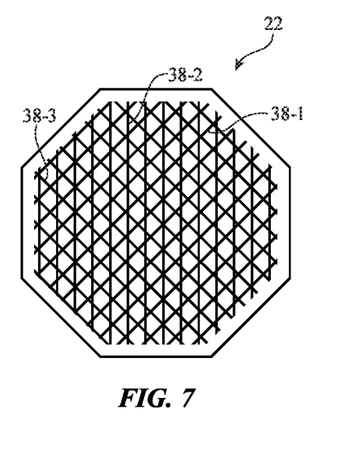
FIG. 7 is a top view of an illustrative adjustable lens component having arrays of electrodes that extend along first, second, and third directions in accordance with an embodiment.

FIG. 7 is a top view of an illustrative adjustable lens component 22 having first finger electrodes 38-1 oriented along a first direction, second finger electrodes 38-2 oriented along a second direction, and third finger electrodes 38-3 oriented along a third direction. Finger electrodes 38-1, 38-2, and 38-3 may, for example, be separated by 60-degree angles or may have other suitable orientations. Each set of electrodes may modulate the phase profile of a respective liquid crystal layer along an associated dimension. Adjustable lens components 22 of the type shown in FIG. 7 with three orientations of electrodes may therefore be used to create phase profiles that vary along three dimensions.

The examples of FIGS. 6 and 7 in which lens component 22 includes two and three orientations of electrodes, respectively, are merely illustrative. If desired, lens component 22 may include one, two, three, four, five, six, more than six, or any other suitable number of orientations of electrodes to enable lens component 22 to achieve different phase profiles across any suitable number of dimensions. Lens components 22 with multiple orientations of electrodes may be configured to simultaneously correct for optical aberrations such as defocus, astigmatism, coma, trefoil, spherical, and/or other aberrations. Arrangements in which adjustable lens components 22 include three orientations of electrodes are sometimes described herein as an illustrative example.

Figure 8:
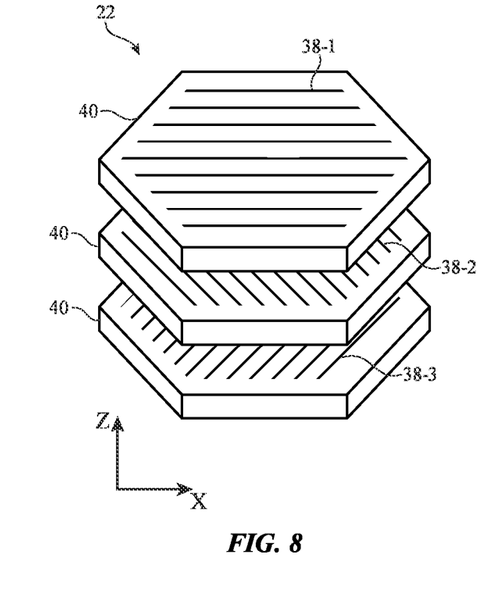
FIG. 8 is an exploded perspective view of an illustrative adjustable lens having first, second, and third liquid crystal cells, each with an associated orientation of electrodes, in accordance with an embodiment.
Figure 9:
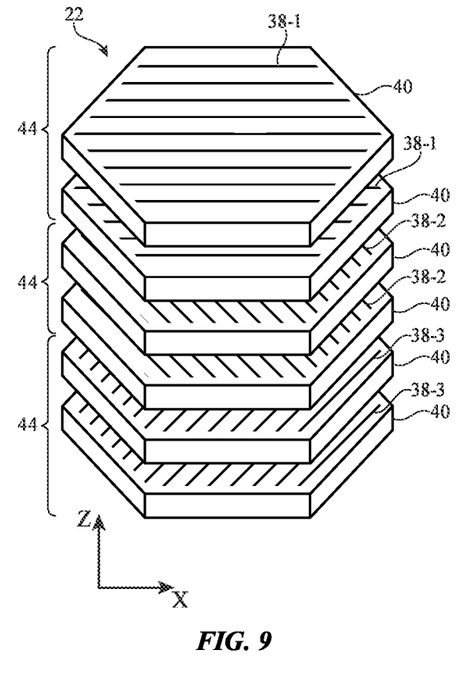
FIG. 9 is an exploded perspective view of an illustrative adjustable lens having first, second, and third liquid crystal modules, each with an associated orientation of electrodes, in accordance with an embodiment.

FIGS. 8 and 9 show exploded perspective views of illustrative lens components 22 with three orientations of electrodes. In the example of FIG. 8, adjustable lens components 22 include three liquid crystal cells 40. Each liquid crystal cell 40 may have a structure of the type described in connection with FIG. 2, with finger electrodes 38-1, 38-2, and 38-3 oriented along three different directions. For example, finger electrodes 38-1 may be oriented at 0 degrees relative to the X-axis, finger electrodes 38-2 may be oriented at 120 degrees relative to the X-axis, and finger electrodes 38-3 may be oriented at 60 degrees relative to the X-axis. This is merely illustrative, however. In general, electrodes 38-1, 38-2, and 38-3 may have any suitable orientation.

In the example of FIG. 9, adjustable lens components 22 include three liquid crystal modules 44. Each liquid crystal module 44 may have a structure of the type described in connection with FIG. 3. In particular, each liquid crystal module 44 may include an upper liquid crystal cell 40 and a lower liquid crystal cell 40. The liquid crystal layers of the upper and lower liquid crystal cells 40 may, if desired, have antiparallel liquid crystal alignment orientations. As shown in FIG. 9, finger electrodes 38-1, 38-2, and 38-3 of liquid crystal modules 44 are oriented along three different directions. For example, finger electrodes 38-1 may be oriented at 0 degrees relative to the X-axis, finger electrodes 38-2 may be oriented at 120 degrees relative to the X-axis, and finger electrodes 38-3 may be oriented at 60 degrees relative to the X-axis. This is merely illustrative, however. In general, electrodes 38-1, 38-2, and 38-3 may have any suitable orientation.

The foregoing examples in which lens components 22 have a rectangular shape (FIG. 6) or a hexagonal shape (FIGS. 7, 8, and 9) are merely illustrative. If desired, lens component 22 (e.g., substrate 30, substrate 32, liquid crystal layer 34, etc.) may have circular shapes, triangular shapes, pentagonal shapes, oval shapes, ergonomic shapes, convex shapes, or any other suitable shape. Arrangements in which lens components 22 are hexagonal are sometimes described herein as an illustrative example.

In some arrangements, control circuitry 26 may modulate the lens power across the entirety of each lens component 22. This type of arrangement may be useful in configurations where glasses 14 do not include sensor system 24 for eye tracking and/or when the tuning speed of lens components 22 is not sufficiently high to maintain focus when the user's eye moves. Modulating the lens power from edge to edge of components 22 may ensure that the image remains in focus even when the user's eye moves around.

In other arrangements, control circuitry 26 may modulate lens power across only a portion of lens component 22. This type of foveated lens arrangement is illustrated in FIG. 10.

Viewers are most sensitive to image detail in the main field of view. Peripheral regions of a lens may therefore be provided with a different phase profile than the region of the lens within the user's gaze. The peripheral regions of the lens that are outside of the viewer's gaze may, for example, be optically unmodulated, may be provided with a phase profile that is constant across a given area, and/or may be provided with a phase profile that is less spatially varied than the portion of the lens in the direction of the viewer's gaze. The regions of the lens outside of the user's gaze may have an optical power magnitude that is less than the optical power magnitude of the lens region within the user's gaze. By including lower power areas in a variable-power lens, total required variable phase depth and power consumption can be minimized and/or reduced. Further, magnification changes (which could be disorienting to the user) are experienced only over the area of the lens where focal power is modulated. Gaze detection data (e.g., gathered using sensor system 24) may be used in determining which portion of lens component 22 is being directly viewed by viewer 16 and should therefore have the optically appropriate prescription and which portions of lens components 22 are in the viewer's peripheral vision and could be left optically unmodulated or otherwise provided with a phase profile having less spatial variation than the portions of lens components 22 within the viewer's gaze.

Figure 10:
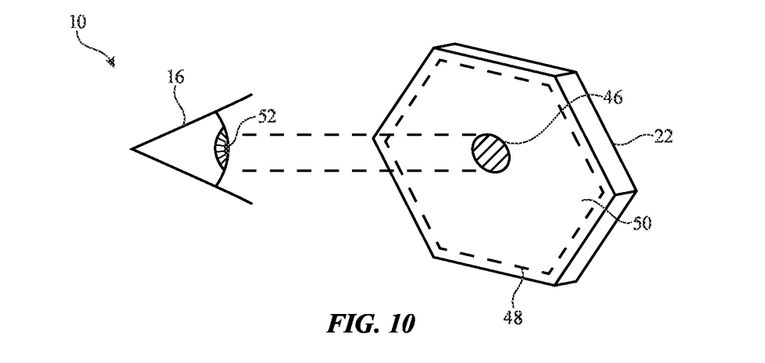
FIG. 10 is a perspective view of a foveated adjustable lens system in accordance with an embodiment.

As shown in FIG. 10, for example, adjustable lens component 22 may have an active area such as active area 48. Within active area 48, adjustable lens components 22 may include one or more materials having an electrically adjustable index of refraction (e.g., liquid crystal cells 40 of the type discussed in connection with FIGS. 2-9). Control circuitry 26 may dynamically adjust the phase profile of lens components 22. Active area 48 may include gaze area 46 and peripheral area 50. Gaze area 46 corresponds to the portions of lens components 22 that are within the user's gaze, whereas peripheral area 50 corresponds to the portions of lens components 22 that are outside of the user's gaze (e.g., portions of lens components 22 that are in the user's peripheral vision). Gaze area 46 of lens components 22 may be provided with a different phase profile than peripheral area 50. For example, gaze area 46 may be optically modulated to produce a first lens power, while peripheral area 50 may be left optically unmodulated, may be optically modulated to produce a second lens power magnitude that is less than the first lens power magnitude, and/or may be optically modulated to produce a phase profile that is less spatially varied than the phase profile of gaze area 46.

Control circuitry 26 may dynamically adjust the location, size, resolution, or shape of gaze area 46 and peripheral area 50 during operation of glasses 14. For example, control circuitry 26 may use sensor system 24 to track a user's gaze and may adjust the location of gaze area 46 so that it remains aligned with the user's gaze. If desired, the size of gaze area 46 may be based on the size of the foveal region in a user's eyes, the user's pupil diameter, and/or the desired phase profile for gaze area 46. Gaze area 46 may, for example, have a diameter between 4 mm and 9 mm, between 7 mm and 9 mm, between 6 mm and 10 mm, between 4 mm and 8 mm, between 8 mm and 12 mm, greater than 10 mm, less than 10 mm, or any other suitable size. The size of gaze area 46 may be based on a distance between lens components 22 and a user's eyes 16, may be based on the size of the user's pupil 52 (e.g., as measured with sensor system 24 or as inferred based on eye charts, ambient light levels, or other data), and/or may be based on other information.

In gaze area 46, control circuitry 26 may modulate the index of refraction of liquid crystal material 34 to obtain the desired lens power and the desired vision correction properties for the viewer. This may include, for example, controlling each finger electrode 38 independently or controlling small sets of finger electrodes 38 with common control signals. In peripheral area 50, control circuitry 26 may control larger sets of finger electrodes 38 with common control signals and/or may provide a ground or baseline voltage to finger electrodes 38 (e.g., may deactivate some finger electrodes 38). If desired, optical power may be constant across gaze area 46 and phase may be flat across peripheral area 50. In other suitable arrangements, optical power may be varied across gaze area 46 and/or peripheral area 50.

Figure 11:
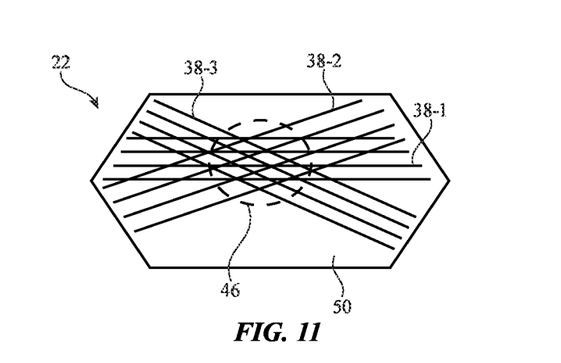
FIG. 11 is a top view of an illustrative adjustable lens system having a subset of electrodes driven such as to create a lens patch with variable optical power that aligns with a user's gaze in accordance with an embodiment.

FIG. 11 is a top view of illustrative adjustable lens components 22 showing how areas of different optical power magnitude may be achieved. As shown in FIG. 11, adjustable lens components 22 may include gaze area 46 and peripheral area 50. Gaze area 46 may have a first lens power magnitude and peripheral area 46 may have a second lens power magnitude that is less than the first lens power magnitude. Gaze area 46 may, for example, align with the foveal region of a user's eyes 16 (as shown in FIG. 10). Electrodes that overlap (i.e., pass through) gaze area 46 such as electrodes 38-1, 38-2, and 38-3 may be controlled to make a desired prescription within gaze area 46 and electrodes that do not pass through gaze area 46 (not shown in FIG. 11) may be controlled to produce a spatially constant phase or a phase that otherwise has less spatial variation than that of gaze area 46.

Control circuitry 26 may dynamically adjust the location of gaze area 46 based on gaze location information from sensor system 24 by actively identifying which electrodes are within a user's gaze and which electrodes are outside of a user's gaze. Electrodes within a user's gaze (e.g., in area 46) may be operated in optically modulated mode, and electrodes outside of the user's gaze (e.g., in area 50) may be operated in constant phase mode or may otherwise be operated to produce a phase profile with less spatial variation than that of gaze area 46.

Whereas lens components with only two different electrode orientations (e.g., lens component 22 of FIG. 6) may be capable of expressing spherical profiles and correcting one of two modes of astigmatism, lens components with three or more electrode orientations may be capable of expressing a greater number of different types of phase profiles (to correct higher order aberrations, astigmatism with any rotational axis, coma, spherical aberration, etc.). Additionally, using more than two electrode orientations may help ease the transition between gaze region 46 (e.g., where the phase profile of liquid crystal layer 34 is actively controlled) and peripheral region 50 (e.g., where the phase profile of liquid crystal layer 34 is not actively controlled).

Figure 12:
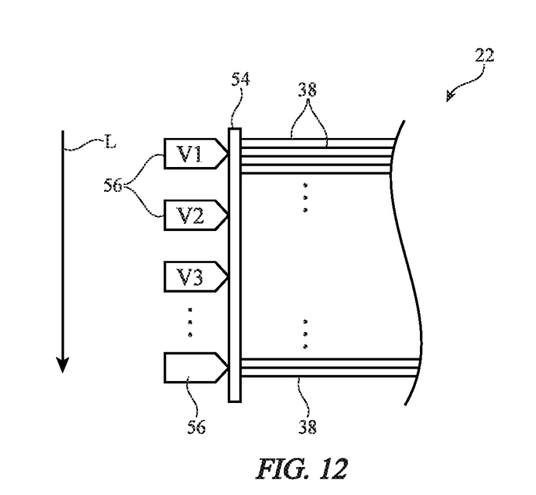
FIG. 12 is a diagram of an illustrative adjustable lens having an array of electrodes that receive control signals from control signal lines through a resistive strip in accordance with an embodiment.

It may be desirable to form finger electrodes with a relatively fine pitch. If care is not taken, large gaps between adjacent finger electrodes 38 can lead to optical defects such as unwanted diffraction and phase profile imperfections. FIG. 12 shows an illustrative arrangement for obtaining closely spaced finger electrodes 38. As shown in FIG. 12, finger electrodes 38 may receive control signals from control signal lines 56. The spacing between adjacent control signal lines 56 may be greater than the spacing between finger electrodes 38. Each control signal line 56 may provide an associated voltage (e.g., V1, V2, V3, etc.) to conductive electrodes 38 through a resistive strip 54. Resistive strip 54 may be formed from a conductive material such as transparent conductive material (e.g., indium tin oxide), metal (e.g., tungsten, gold, silver, or other suitable metals), polysilicon, or other conductive material. Resistive strip 54 may have distributed resistance levels that vary along length L. Resistive strip 54 may take a serpentine path or a straight path, as illustrated in FIG. 12. Resistive strip 54 electrically couples control signal lines 56 to finger electrodes 38 and helps distribute control signals to the array of finger electrodes 38. Due to the resistance of strip 54, the voltage applied to electrodes 38 varies (e.g., varies linearly) from V1 to V2, from V2 to V3, etc. For example, an electrode 38 half way between control signal line 56 providing voltage V1 and control signal line 56 providing voltage V2 may receive a voltage that is halfway between voltages V1 and V2.

Figure 13:
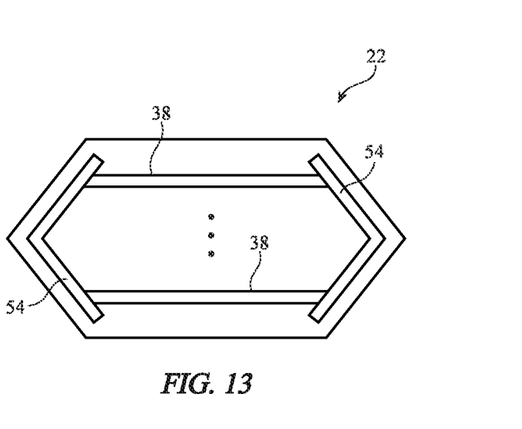
FIG. 13 is a top view of an illustrative adjustable lens having resistive strips along opposing edges of the lens in accordance with an embodiment.

FIG. 13 is a top view of lens components 22 showing how resistive strip 54 may be located at one or more edges of the lens. For example, first and second strips may be coupled to first and second opposing ends of finger electrodes 38 to drive finger electrodes 38 from both sides. This is, however, merely illustrative. If desired, strip 54 may only be located on one side of lens 22, may be located on three or more sides of lens 22, or may extend continuously around the perimeter of lens 22. Resistive strip 54 may, for example, be formed on each substrate 30 in lens 22 to distribute control signals to each orientation of electrodes 38.

Control circuitry 26 may provide control signals to control signal lines 56, which may in turn apply voltages to finger electrodes 38 through resistive strip 54. Control circuitry 26 may include one or more integrated circuits mounted directly to lens 22 (e.g., in a chip-on-glass arrangement) or may include one or more integrated circuits mounted to a separate substrate and coupled to lens 22 through one or more flex circuits or other types of paths.

In arrangements where lens component 22 includes multiple liquid crystal cells 40, it may be desirable to use a flexible substrate (e.g., for substrate 30 and/or substrate 32 in each cell 40). For example, substrate 30 and/or substrate 32 may be formed from flexible materials such as a flexible polymer (e.g., polyimide or other suitable polymer), cellulose triacetate (TAC), or other suitable flexible material. The use of a flexible substrate in liquid crystal cells 40 may allow for thinner substrates (e.g., 40 microns or other suitable thickness) that are still robust. Additionally, flexible substrates can be deformed or bent in one or more dimensions, which may allow lens component 22 to be embedded in or laminated to a standard lens in eyeglasses with a meniscus shape (e.g., convexo-concave eyeglasses or other contoured eyeglasses).

Flexible substrates may also alleviate the challenge of electrically interfacing with each liquid crystal cell 40 in lens component 22. For example, multiple liquid crystal cells 40 in lens component may share a common pair of substrates formed from flexible material that has been bent and folded.

Figure 14:
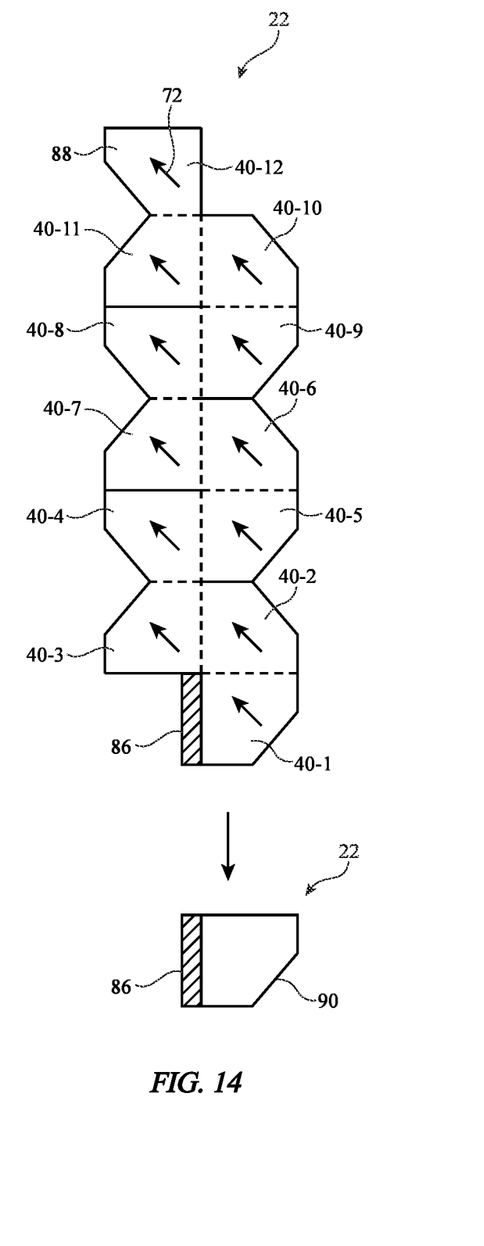
FIG. 14 is a top view of an illustrative adjustable lens component in which multiple liquid crystal cells share a common pair of substrates that may be cut and folded in accordance with an embodiment.

FIG. 14 shows an example of an illustrative lens component 22 with twelve liquid crystal cells 40 that share a common pair of flexible substrates. For example, first and second sheets of flexible material 88 may be used to form substrates 30 and 32, respectively, of liquid crystal cells 40-1, 40-2, 40-3, 40-4, 40-5, 40-6, 40-7, 40-8, 40-9, 40-10, 40-11, and 40-12 of adjustable lens component 22. By cutting flexible material 88 along the solid lines of FIG. 14 and folding flexible material 88 along the dashed lines of FIG. 14, the 12 liquid crystal cells 40 may be stacked to form lens component 22, as shown in the lower portion of FIG. 14. Prior to folding flexible material 88, a single rubbing process may be performed, such that all liquid crystal cells 40 have liquid crystal alignment orientation 72 prior to folding. After being cut and folded, lens component 22 may modulate light of two polarizations, with two antiparallel liquid crystal alignment orientations for each polarization. Additionally, electrodes 38 in each of the twelve liquid crystal cells 40 may be oriented such that the twelve liquid crystal cells 40 have twelve distinct electrode orientations after lens component 22 is folded.

The fact that all twelve liquid crystal cells 40 share a common pair of flexible substrates may simplify electrical connections, allowing conductive traces to pass through some or all of the twelve cells to couple to pad 86 (e.g., where lens component 22 is coupled to external circuitry). If desired, angled edge 90 may be located adjacent to the bridge of a user's nose when worn by the user.

Figure 15:
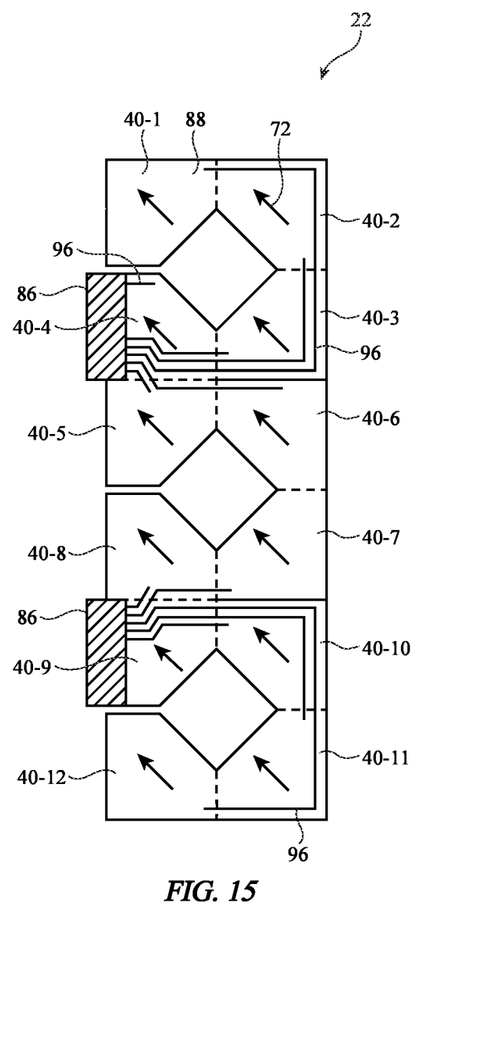
FIG. 15 is a top view of an illustrative adjustable lens component in which multiple liquid crystal cells share a common pair of substrates that may be cut and folded in accordance with an embodiment.

FIG. 15 shows another illustrative geometry that may be used for lens component 22. As in the example of FIG. 14, lens component 22 of FIG. 15 includes twelve liquid crystal cells 40, which may include substrates 30 and 32 formed from common sheets of flexible material 88. Flexible material 88 may be cut along the solid lines of FIG. 15 and folded along the dashed lines of FIG. 15 to form a stack of twelve liquid crystal cells 40. Prior to being folded, a single rubbing process may be used so that all cells 40 initially have liquid crystal alignment orientation 72. After being cut and folded, lens component 22 may modulate light of two polarizations, with two antiparallel liquid crystal alignment orientations for each polarization. Additionally, electrodes 38 in each of the twelve liquid crystal cells 40 may be oriented such that the twelve liquid crystal cells 40 have twelve distinct electrode orientations after lens component 22 is folded.

The fact that all twelve liquid crystal cells 40 share a common pair of flexible substrates may simplify electrical connections, allowing conductive traces to pass through some or all of the twelve cells to couple to pad 86 (e.g., where lens component 22 is coupled to external circuitry). In the example of FIG. 15, lens component 22 has first and second pads 86. When lens component 22 is cut and folded, first and second pads 86 may be located on opposite sides of lens component 22. Additionally, the use of first and second pads 86 helps simplify electrical connections to the twelve cells 40. A first set of traces 96 may couple the top six cells 40 to one pad 86, while a second set of traces 96 may couple the bottom six cells 40 to the other pad 86.

The examples of FIGS. 14 and 15 are merely illustrative. If desired, other geometries and folding arrangements may be used, and/or component 22 may include more or less than twelve liquid crystal cells 40.

In arrangements where adjustable lens component 22 includes multiple liquid crystal cells 40, it may be challenging to provide the desired control signals to finger electrodes 38. Even when a resistive strip 54 (FIG. 12) is used to distribute control signals from a control signal line 56 to multiple finger electrodes 38 (thereby allowing for fewer control signal lines 56 than finger electrodes 38), there still may be many control signal lines 56 for each liquid crystal cell 40. For example, each liquid crystal cell 40 may include 100 to 200 control signal lines 56, 200 to 300 control lines 56, 300 to 400 control lines 56, more than 400 control lines 56, less than 40 control lines 56, or other suitable number of control lines 56. When combined with other liquid crystal cells 40, there may be thousands (e.g., more than 3000, more than 4000, less than 4000, or other suitable number) of control lines 56 in a single adjustable lens component 22, which may only be a few centimeters wide (e.g., 3 cm to 4 cm wide, 2 cm to 5 cm wide, more than 5 cm wide, less than 5 cm wide, etc.).

To reduce the number of signal paths needed from off-lens control circuitry (e.g., portions of control circuitry 26 in eyeglasses 10 that are not located on lens 22) to control signal lines 56 on lens component 22, adjustable lens component 22 may include digital control circuitry and multiplexers that are used to select a desired voltage for each control signal lines 56 from a "palette" of voltages (e.g., a predetermined set of desired voltages to select from, similar to an artist's palette of colors to select from) that are generated by the off-lens control circuitry (e.g., portions of control circuitry 26 that are not physically located on lens component 22). The set of voltages in the voltage palette may be predetermined in the sense that the voltages are determined by the off-lens control circuitry before being conveyed to lens component 22 (e.g., via a connector such as a flexible printed circuit). However, the set of voltages in the voltage palette need not be static and may, if desired, be adjusted dynamically by the off-lens control circuitry during operation of lens 22.

Figure 16:
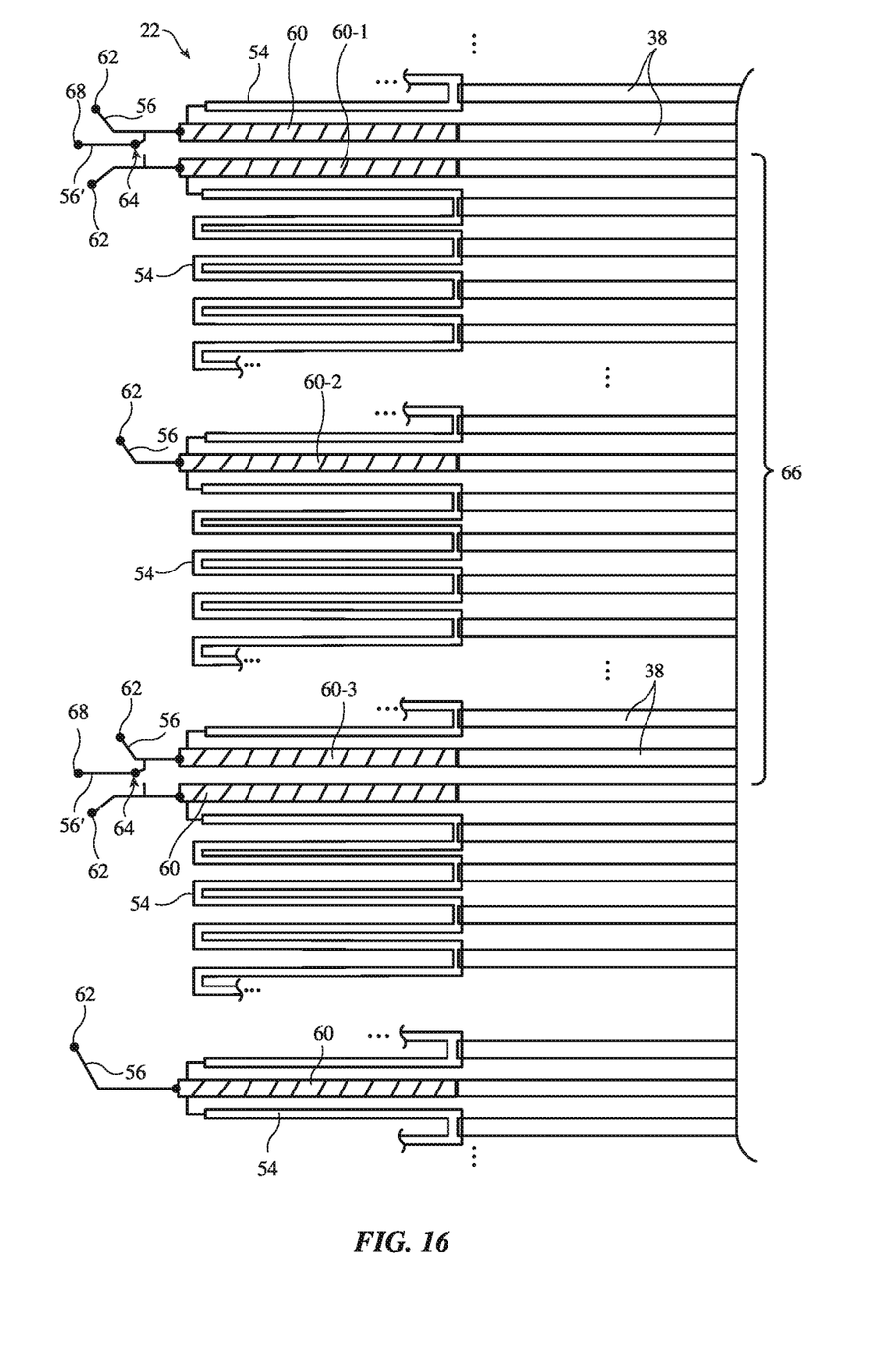
FIG. 16 is a top view of an illustrative adjustable lens component having variable-resistance serpentine paths that each couple a group of finger electrodes to a terminal in accordance with an embodiment.

FIG. 16 is a top view of an illustrative lens component 22 showing how resistive strips 54 may distribute control signals from control signal lines 56 to finger electrodes 38 (e.g., patterned electrodes 38 in a given one of liquid crystal cells 40 such as liquid crystal cells 40 of FIG. 14, FIG. 15, or any of the other previously described figures). As shown in FIG. 16, each resistive strip 54 follows a serpentine path, snaking back and forth between adjacent finger electrodes 38. Each resistive strip may be coupled to 5-10 electrodes 38, 10-15 electrodes 38, 20-25 electrodes 38, fewer than 20 electrodes 38, more than 20 electrodes 38, or other suitable number of electrodes 38. The opposing ends of each resistive strip 54 may be coupled to a conductor such as conductor 60. Conductor 60 may be used to supply a voltage from control signal line 56 to resistive strip 54. Conductor 60 may be formed from metal, a transparent conductive oxide, or other suitable conductive material.

Some of conductors 60 may be coupled to first and second adjacent resistive strips 54, thereby allowing for a smooth voltage profile to be provided across the finger electrodes 38 that are coupled to the first and second adjacent resistive strips 54. For example, conductors 60-1, 60-2, and 60-3 may be used to apply voltages to a first resistive strip 54 between conductor 60-1 and conductor 60-2 and a second resistive strip 54 between conductor 60-2 and conductor 60-3. This allows resistive strips 54 to distribute a smooth voltage profile across electrodes 38 in region 66.

It may be desirable to have the option to decouple adjacent resistive strips 54 to create an abrupt change in the phase profile across liquid crystal cell 40 when desired. This may be achieved by placing two conductors 60 between some pairs of adjacent resistive strips 54 and coupling the two conductors 60 with a switch such as switch 64. When switch 64 is open, the resistive strips 54 on opposing sides of switch 64 may be decoupled, thereby allowing for an abrupt phase change profile in that region of liquid crystal cell 40. When switch 64 is closed, the voltage profile will change more smoothly across the two resistive strips 54 as if there were no break between the two resistive strips 54. Control signal lines 56' may be used to provide control signals to switch 64 to thereby open and close switch 64 when desired. The use of switches 64 is merely illustrative, however. If desired, switches 64 may be omitted and there may be permanent breaks between some pairs of adjacent resistive strips 54 and/or there may be permanent electrical coupling between adjacent resistive strips 54.

Control signal lines 56 and 56' may have respective terminals that receive a voltage from control circuitry 26. For example, control signal lines 56 that provide control signals to conductors 60 may each have a terminal such as terminal 62, and control signal lines 56' that provide control signals to switches 64 may each have a terminal such as terminal 68. To reduce the number of signal lines between off-lens control circuitry and lens 22, each terminal 62 may be coupled to a multiplexer and digital control circuitry that select a desired voltage for that terminal 62 from a palette of voltages that are generated off of lens 22 by off-lens control circuitry. This type of arrangement is illustrated in circuitry 124 of FIG. 17.

Figure 17:
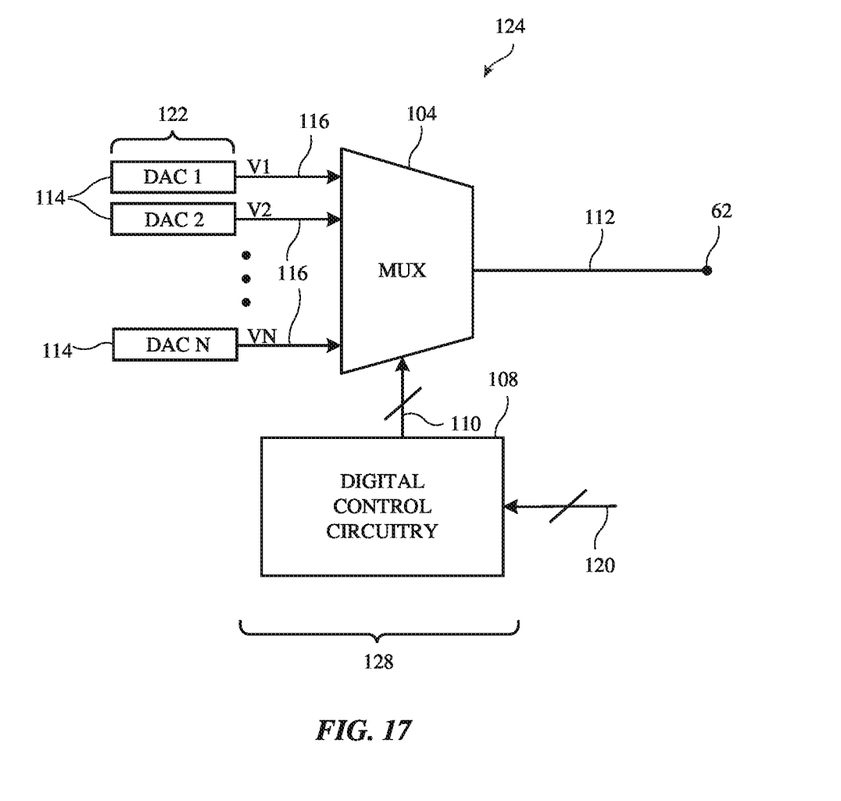
FIG. 17 is a schematic diagram of illustrative digital circuitry that may be used in an adjustable lens component to select a desired voltage from a voltage palette in accordance with an embodiment.

As shown in FIG. 17, each terminal 62 on lens component 22 may receive a voltage from a multiplexer such as multiplexer 104 that is also located on lens 22. Multiplexer 104 may select which voltage to output to terminal 62 from a palette of voltages V1, V2, . . . VN that is generated by off-lens control circuitry such as off-lens control circuitry 122 (e.g., off-lens control circuitry that forms part of control circuitry 26 of FIG. 1 or other off-lens control circuitry). Off-lens control circuitry 122 may include one or more digital-to-analog converter circuits such as digital-to-analog converter circuits 114 that provide analog voltages V1, V2, . . . VN on data input lines 116 to multiplexer 104 (where N is equal to the number of data input lines 116 and thus equal to the number of voltages in the voltage palette). The number of data input lines 116 may be any suitable number, depending on the number of voltages it is desired to have in the voltage palette that multiplexer 104 uses for providing voltages to terminal 62. For example, if a palette of 40 different voltages is desired, there may be 40 different data input lines 116 to each multiplexer 104 (e.g., N may be equal to 40). This is, however, merely illustrative. If desired, N may be equal to 20, 30, 35, 45, 50, 60, 64, more than 64, less than 64, or any other suitable number.

The voltages V1, V2, . . . VN in the voltage palette need not be static and may, if desired, be adjusted dynamically by off-lens control circuitry 122 before being conveyed to lens 22 (e.g., via a flex circuit cable or other suitable connection between off-lens control circuitry 122 and lens component 22). For example, V1 on a first data input line 116 may be equal to −V for one frame of data and may be equal to +V for a subsequent frame of data. In general, off-lens control circuitry 122 may adjust the specific voltage values in the voltage palette in any suitable fashion during operation of lens 22.

Multiplexer 104 may select which one of the voltages on data input lines 116 to output on output line 112 based on control signals from digital control circuitry 108. Digital control circuitry 108 may receive control bits on input lines 120 and may output control bits to multiplexer 104 on output lines 110. The control bits on output line 110 may instruct multiplexer 104 which data input line 116 to select for output and/or may instruct multiplexer 104 not to couple any data input line 116 to terminal 62. Digital control circuitry 108 may include a single shift register that is N bits wide, may include one or more decoders, may include one or more decoders that receive control bits from one or more shift registers or that receive control bits from other circuitry, and/or may include any other suitable type of digital control circuitry for providing control bits to multiplexer 104. Because multiplexer 104 and digital control circuitry 108 may together be used to select voltages from the palette of voltages generated by off-lens control circuitry 122, multiplexer 104 and digital control circuitry 108 may sometimes be referred to as voltage selection circuitry 128 or on-lens voltage selection circuitry 128. If desired, multiplexer 104 may be a break-before-make multiplexer to avoid connecting two data input lines 116 together.

Figure 18:
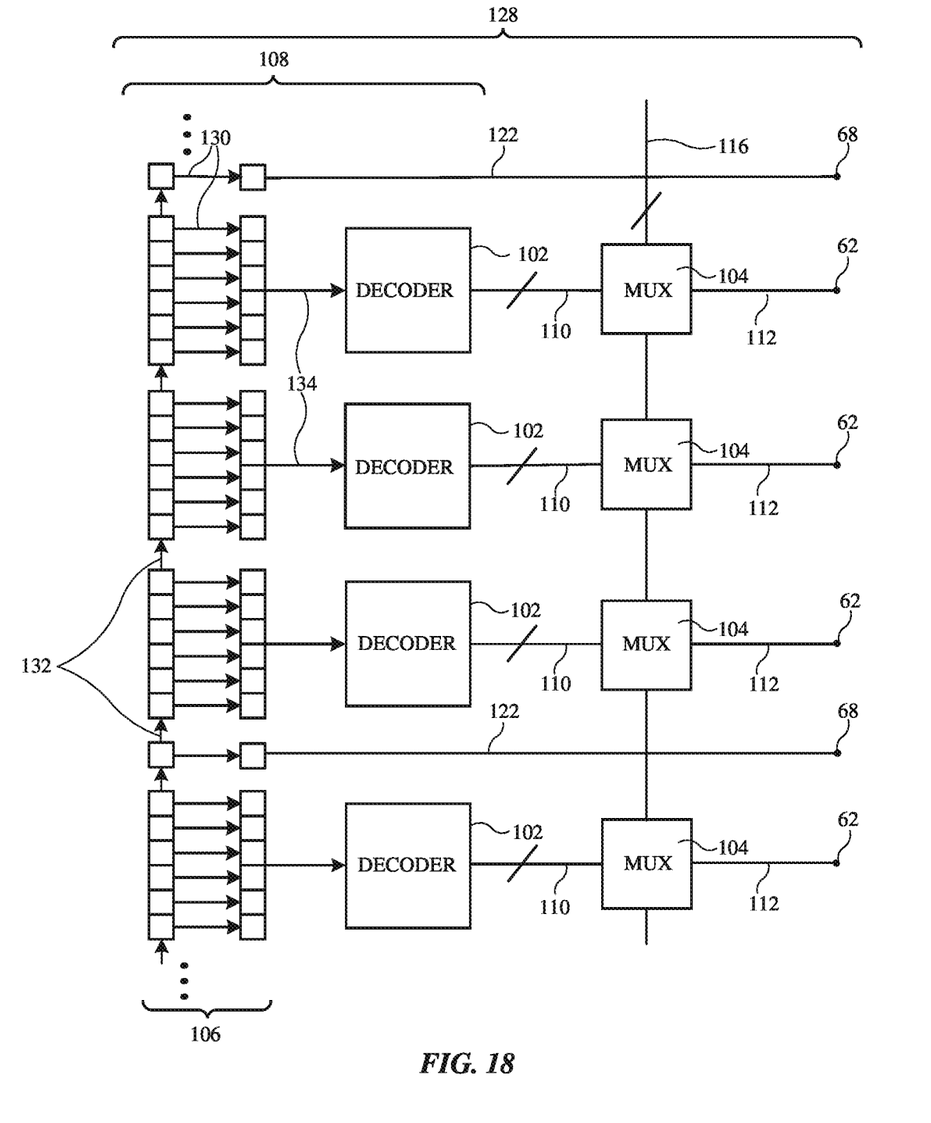
FIG. 18 is a schematic diagram of illustrative shift register and decoder circuitry that may be used in an adjustable lens component to select a desired voltage from a voltage palette in accordance with an embodiment.

FIG. 18 is a schematic diagram of illustrative voltage selection circuitry 128. In the example of FIG. 18, digital control circuitry 108 is implemented using a combination of segmented shift registers such as shift registers 106 and decoders such as decoders 102.

Each shift register 106 may have any suitable number of bits (e.g., 4 bits, 6 bits, 8 bits, more than 8 bits, less than 8 bits, etc.). The structure of decoders 102 may depend on the number of bits in shift registers 106 and the number of voltages in the voltage palette (e.g., the number of data input lines 116). If each shift register 106 has M bits and there are N data input lines 116 (and thus N different voltages in the voltage palette), then each decoder 102 will be an M-bit to N-bit decoder.

Shift registers 106 may receive data signals on lines 132 and may provide enable signals on lines 130. During operation (e.g., when it is desired to update the phase profile of lens 22), data signals are fed into shift registers 106 via lines 132 and the M-bit address signal may be provided to decoders 102 via enable lines 130 and output lines 134. Each decoder 102 may decode the M-bit address signal from an associated shift register 106 to an N-bit control signal that is output to multiplexer 104 on lines 110. In some situations, this N-bit control signal will have one high bit (e.g., one "1") and the rest will be low bits (e.g., all "0"). Multiplexer 104 will couple one of the N data input lines 116 (e.g., the one that is addressed by the high bit in the N-bit signal received from decoder 102) to its output line 112, thereby providing the desired analog voltage to terminal 62. For example, if the first bit in the N-bit control signal from decoder 102 is high and the rest of the bits are low, multiplexer 104 may couple the first data input line 116 to output line 112 and may thereby provide analog voltage V1 (FIG. 17) to terminal 62. In other situations, the N-bit control signal from decoder 102 may instruct multiplexer 104 not to couple any data input line 116 to terminal 62 (e.g., the control signal may be all low bits, if desired).

Consider a scenario in which M is equal to 6 and N is equal to 40. In this example, each shift register 104 has 6 bits, there are 40 data input lines 116, and decoder 104 is a 6-bit to 40-bit decoder. Decoder 102 may decode each 6-bit address signal from shift register 106 to a 40-bit control signal, with 39 "0"s and 1 "1" in the 40-bit signal. This 40-bit control signal may be output on line 110 and may instruct multiplexer 104 which of the 40 data input lines 116 to select and thus which voltage (e.g., V1, V2, . . . VN of FIG. 17) from the voltage palette to output to terminal 62 via output line 112. In general, shift registers 106 may have any suitable number of bits and decoder 102 may accommodate any number of data input lines 116. The example of a 6-bit shift register and a palette of 40 voltages is merely illustrative.

As shown in FIG. 18, shift registers 106 may include one or more single-bit shift registers for providing control signals (e.g., a high signal or a low signal) to terminals 68 for controlling the state of switches 64.

In arrangements where multiplexer 104 includes analog switches formed from thin-film transistors, the thin-film transistors may have limited ability to source current. Thin-film transistors may be made wider to accommodate higher current requirements, but this may consume excessive real estate on a lens component, where space is limited. To balance this tradeoff, it may be desirable to increase the width of certain thin-film transistors in multiplexer 104 to accommodate higher current levels. In other words, the width of the thin-film transistors in multiplexer 104 that are associated with a subset of the N data input lines 116 may be larger than that of the remaining thin-film transistors in multiplexer 104. For example, in a scenario where N is equal to 48, multiplexer 104 may include 44 standard-width transistors (or other suitable number) and 4 wide transistors (or other suitable number) that are wider than the standard-width transistors (e.g., four times as wide, three times as wide, or other suitable width). During operation, voltages with the highest anticipated current demands can be allocated to data input lines 116 that are associated with the wider transistors. This is, however, merely illustrative. If desired, all of the transistors in multiplexer 104 may have the same width, or other combinations of transistors with different widths may be used.

The example of FIG. 18 is merely illustrative. If desired, voltage selection circuitry 128 may be implemented using any other type of digital circuitry that can be used to select a given voltage from a predetermined number of previously generated voltages (e.g., analog voltages generated in off-lens control circuitry 122). By using digital voltage selection circuitry 128 to select a desired analog voltage from a predetermined set of voltages that are generated off of lens 22, analog circuitry on lens 22 may be reduced or eliminated, thereby freeing up valuable real estate on lens 22 and reducing the amount of signal lines needed between lens 22 and off-lens control circuitry 122.

Figure 19:
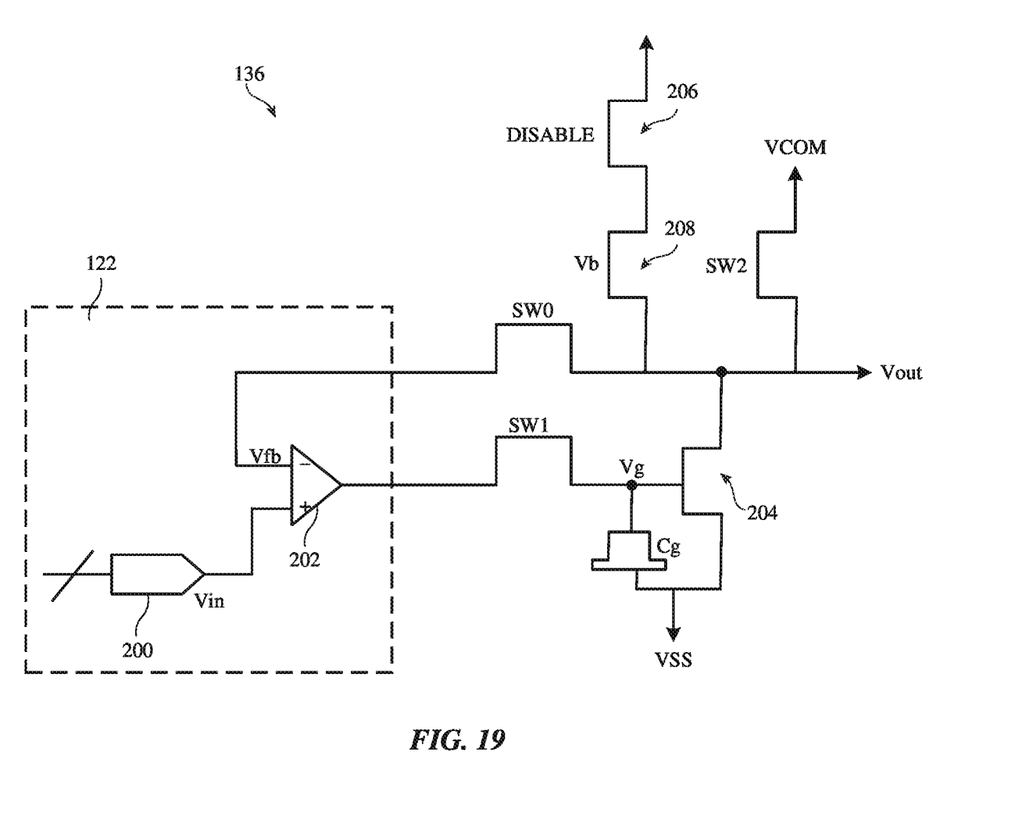
FIG. 19 is a schematic diagram of illustrative circuitry such as an off-lens operational amplifier that may be used to ensure that a voltage provided to an on-lens control line matches a selected input voltage in accordance with an embodiment.

Because multiplexers tend to be weak current sources, it may be desirable to program thin-film transistor circuitry on lens 22 using active feedback from an off-lens operational amplifier to ensure that voltages provided to terminals 62 (and thus conductors 60 and variable-resistance conductive paths 54 that are coupled to terminals 62) match the desired voltages that are generated off-lens. An example of this type of active feedback circuitry is illustrated in FIG. 19.

Active feedback circuit 136 includes an off-lens operation amplifier such as operational amplifier 202. Operational amplifier 202 may, for example, form part of off-lens control circuitry 122 that is located within system 10 (e.g., in housing 12) but that is not physically located on lens 22. The remaining portions of active feedback circuit 136 may be located on lens 22, if desired.

The positive input terminal of operation amplifier 202 may receive a selected input voltage Vin from digital-to-analog converter circuitry 200. Digital-to-analog converter circuitry 200 may include, for example, one of digital-to-analog converter circuits 114 described in connection with FIG. 17, and Vin may, for example, be a selected one of the voltages V1, V2, . . . VN in the predetermined set of voltages generated off-lens (sometimes referred to as a voltage palette) and provided to lens 22 for adjusting the phase profile of lens 22. The value of Vin may be any suitable value (e.g., Vin need not be equal to V1, V2, . . . VN, if desired) and may be generated by digital-to-analog control circuitry with any suitable number of possible outputs (e.g., N outputs, more than N outputs, or less than N outputs).

The output voltage Vout of circuit 136 is fed back to the inverting input of operational amplifier 202 as feedback voltage Vfb through switch SW0. Using feedback voltage Vfb, operational amplifier 202 may ensure that the output voltage Vout of circuit 136 matches the desired input voltage Vin. Output voltage Vout is provided to one of terminals 62 and may be varied based on the current flowing through transistor 204. When SW0 and SW1 are enabled, operational amplifier 202 outputs Vg to the gate of transistor 204. Capacitor Cg may be used to hold voltage Vg at the gate of transistor 204. The gate voltage Vg on transistor 204 controls the amount of current flowing through transistor 204. Transistor 204 is coupled between voltage Vout and ground voltage VSS.

A disable switch 206 (controlled by DISABLE signal) and switch 208 (controlled by bias voltage Vb) are coupled to Vout. When a given region of lens 22 is disabled (e.g., when it is not desired to modulate the phase profile of a given portion of lens 22), Vout may be shorted to VCOM via switch SW2 and no programming is needed. Disable switch 206 may be used to turn off the active feedback so that the output voltage Vout will be equal to common voltage VCOM. If desired, disable switch 206 and switch SW2 may be omitted (e.g., such that the value of Vout is always programmed by off-lens control circuitry 122).

It should be understood that liquid crystal material is merely an example of an electrically modulated optical material that may be modulated using electrodes 38 in cells 40. If desired, cells 40 may include any other suitable type of electrically modulated optical material in place of the liquid crystal material in cells 40.

The foregoing is merely illustrative and various modifications can be made to the described embodiments. The foregoing embodiments may be implemented individually or in any combination.

What is claimed is:

1. An adjustable lens configured to be worn in front of a user's eye, comprising:
   an electrically modulated optical material interposed between first and second transparent substrates;
   a common electrode on the first substrate;
   an array of patterned electrodes on the second substrate that adjust a phase profile of the electrically modulated optical material;
   an array of variable-resistance conductive paths that are each coupled to a respective subset of the patterned electrodes;
   a switch coupled between two of the variable-resistance conductive paths in the array of variable-resistance conductive paths; and
   digital voltage selection circuitry that selects an analog voltage from a predetermined set of voltages that are generated off of the adjustable lens and that provides the selected analog voltage to a respective one of the variable-resistance conductive paths.

2. The adjustable lens defined in claim 1, wherein the digital voltage selection circuitry comprises a multiplexer.

3. The adjustable lens defined in claim 2 wherein the multiplexer receives the predetermined set of voltages on a set of data input lines.

4. The adjustable lens defined in claim 3 wherein the digital voltage selection circuitry comprises digital control circuitry that provides control bits to the multiplexer and wherein the multiplexer selects the analog voltage based on the control bits received from the digital control circuitry.

5. The adjustable lens defined in claim 4 wherein the digital control circuitry comprises a decoder.

6. The adjustable lens defined in claim 4 wherein the digital control circuitry comprises a shift register.

7. The adjustable lens defined in claim 4 wherein the digital control circuitry comprises a decoder and a shift register that provides an address signal to the decoder.

8. The adjustable lens defined in claim 7 wherein the decoder decodes the address signal to the control bits and provides the control bits to the multiplexer.

9. The adjustable lens defined in claim 1 wherein each of the variable-resistance conductive paths has a serpentine pattern and has first and second opposing ends coupled respectively to first and second metal conductors.

10. The adjustable lens defined in claim 9 wherein the digital voltage selection circuitry provides the selected analog voltage to a respective one of the variable-resistance conductive paths via the first metal conductor.

11. The adjustable lens defined in claim 1 wherein the electrically modulated optical material comprises liquid crystal material.

12. An adjustable lens comprising a stack of liquid crystal cells, wherein each liquid crystal cell comprises:
   liquid crystal material interposed between first and second substrates;
   an array of transparent conductive electrodes that adjust a phase profile of the liquid crystal material;
   an array of serpentine conductive paths on opposing sides of the array of transparent conductive electrodes, wherein each of the serpentine conductive paths is coupled to a group of the transparent conductive electrodes; and
   an array of multiplexers, each of which provides a voltage to a respective one of the serpentine conductive paths, wherein the voltage is selected from a predetermined set of voltages that are generated off of the adjustable lens.

13. The adjustable lens defined in claim 12 further comprising an array of decoders, each of which provides control signals to an associated one of the multiplexers.

14. The adjustable lens defined in claim 13 further comprising an array of shift registers, each of which provides address signals to an associated one of the decoders.

15. The adjustable lens defined in claim 12 wherein the array of serpentine conductive paths comprises first and second serpentine conductive paths, the adjustable lens further comprising a switch coupled between the first and second serpentine conductive paths.

16. The adjustable lens defined in claim 12 wherein the array of transparent conductive electrodes and the array of serpentine conductive paths comprise indium tin oxide.

17. Eyeglasses, comprising:
   a housing;
   an adjustable lens in the housing having a liquid crystal cell, an array of electrodes, and control lines that apply voltages to the array of electrodes to adjust a phase profile of the liquid crystal cell; and
   off-lens control circuitry in the housing having an operational amplifier that receives a feedback voltage from the adjustable lens and that provides an output voltage to a given one of the control lines based on the feedback voltage and based on a selected input voltage that is generated by the off-lens control circuitry, wherein the adjustable lens comprises first and second variable-resistance conductive paths and a switch coupled between the first and second variable-resistance conductive paths, wherein each of the first and second variable-resistance conductive paths is coupled to a respective subset of the electrodes, and wherein a given one of the first and second variable-resistance conductive paths receives the output voltage from the given one of the control lines.

18. The eyeglasses defined in claim 17 wherein the operational amplifier has a high impedance inverting input and wherein the feedback voltage is fed to the high impedance inverting input of the operational amplifier.

19. The eyeglasses defined in claim 18 wherein the selected input voltage is one of a predetermined set of input voltages generated by the off-lens control circuitry.

\* \* \* \* \*